United States Patent
Thummel

[19]

[11] Patent Number: 6,117,382
[45] Date of Patent: Sep. 12, 2000

[54] METHOD FOR ENCASING ARRAY PACKAGES

[75] Inventor: Steven G. Thummel, Boise, Id.

[73] Assignee: Micron Technology, Inc., Boise, Id.

[21] Appl. No.: 09/019,226

[22] Filed: Feb. 5, 1998

[51] Int. Cl.[7] .................... B29C 70/70; B29C 70/74
[52] U.S. Cl. ................ 264/272.14; 264/272.15; 264/272.17
[58] Field of Search ................ 264/272.11, 272.13, 264/272.14, 272.15, 272.17; 425/116, 123, 544; 438/107, 109, 112

[56] References Cited

U.S. PATENT DOCUMENTS

| | | |
|---|---|---|
| 5,034,350 | 7/1991 | Marchisi ........................ 264/272.17 |
| 5,114,880 | 5/1992 | Lin . |
| 5,147,815 | 9/1992 | Casto ................................ 437/51 |
| 5,222,014 | 6/1993 | Lin . |
| 5,239,806 | 8/1993 | Maslakow . |
| 5,313,365 | 5/1994 | Pennisi et al. . |
| 5,331,205 | 7/1994 | Primeaux . |
| 5,366,364 | 11/1994 | Tanaka et al. . |
| 5,458,694 | 10/1995 | Nuyen ................................ 136/249 |
| 5,488,257 | 1/1996 | Bhattacharyya et al. . |
| 5,578,261 | 11/1996 | Manzione et al. . |
| 5,597,643 | 1/1997 | Weber . |
| 5,598,034 | 1/1997 | Wakefield . |
| 5,608,262 | 3/1997 | Degani et al. . |
| 5,609,889 | 3/1997 | Weber . |
| 5,614,441 | 3/1997 | Hosokawa et al. ................ 437/207 |
| 5,615,089 | 3/1997 | Yoneda et al. . |
| 5,646,829 | 7/1997 | Sota ................................ 361/813 |
| 5,755,914 | 5/1998 | Yonehara ......................... 156/281 |
| 5,830,781 | 11/1998 | Acello et al. ..................... 438/111 |

*Primary Examiner*—Angela Ortiz
*Attorney, Agent, or Firm*—Trask, Britt & Rossa

[57] ABSTRACT

The upper and lower mold plates of a transfer molding machine are configured for one-side encapsulation of a pair of substrate mounted electronic devices having an opposite conductor-grid-array and/or bare heat sink/dissipator. The pair of devices is positioned back-to-back within a single mold cavity for simultaneous encapsulation. A buffer member, optionally with cut-outs or apertures, may be placed between the two back-to-back substrates for protecting the grid-arrays and enabling encapsulation of devices with varying thicknesses without adjustment of the molding machine. Alternately, the upper and lower plates are configured for one-side encasement using covers of a pair of substrate mounted electronic devices having an opposite conductor-grid-array and/or bare heat sink/dissipator.

17 Claims, 11 Drawing Sheets

METHOD FOR ENCASING ARRAY PACKAGES

BACKGROUND OF THE INVENTION

1. Field of the Invention

This invention relates generally to packaging of electronic circuit device components. More particularly, the invention pertains to packaging arrangements for such device components mounted on an array substrate, though not limited to a method for encasing or covering such electronic devices. The invention further pertains to packaging arrangements for such device components mounted on an array substrate and devices for enclosing or sealing such components.

2. State of the Art

Modern packaged integrated circuits (IC) comprise one or more encased semiconductor devices or chips within a protective "package" of plastic, ceramic, moldable material, or metal or other preformed material, such as caps. The integrated circuit chips are made from a semiconductor material such as silicon, germanium or gallium arsenide, and microscopic circuits are formed on a surface of each chip surface by photolithographic techniques. A plurality of external connections, typically designed for soldering or slide connections, are connected to bond pads on one or more encased chips, enabling the chips to be electrically interconnected to an external electrical apparatus. In one form of interconnection, a substrate such as a wiring board or circuit board has an array of conductors which is typically connected to the wire bond pads of the chips. Portions of the conductors extend through the substrate, typically in through-holes or vias to the opposite side for conductive, e.g. solder, connection to another electronic apparatus. In addition to one or more semiconductor devices (chips or dies) attached to the substrate, or in lieu thereof, other devices such as resisters, capacitors, etc., as well as the conductive leads and wires, may be mounted to the substrate and incorporated in the circuit. Such elements are encased in plastic, ceramic or other material for protection.

Plastic encapsulation of semiconductor and other electronic devices by transfer molding is a well-known and much-used technique. Typically, a large number of components or devices is placed in a lower mold plate or half of an open multi-cavity mold, one device within each cavity. The mold is closed with a mating upper plate. The cavities of the mold are connected by tiny "feed runners", i.e. channels to a "pot" or reservoir from which pressurized liquified plastic is fed. Typically, a constricted channel known as a "gate" is located at the entrance to each mold cavity to limit the flow rate and injection velocity of liquified plastic into the cavity.

Where it is desired to encase the electronic components mounted on one side of a circuit board or wiring board, while leaving uncovered an array of terminals on the opposite side, a peripheral portion of the board (or of a portion encompassing a mounted circuit) is clamped and compressed between the upper and lower mold plates to prevent leakage of liquified plastic from the one side of the mold cavity. Typically, the force required to compress the plates together is of the order of tons, even for molding machines having only a few mold cavities.

Typically, powdered or pelletized plastic, e.g. thermoset resin, is placed in the resin pot and pressed by a ram. The heated, pressurized plastic becomes liquified and flows through the feed runners and gates to surround each device on one side of the substrate and fill that portion of each mold cavity, where it subsequently hardens to encapsulate one side of the board and the devices attached to it. Air is expelled from each cavity through one or more vent runners as the plastic melt fills the mold cavities. Following hardening by partial cure of the thermoset plastic, the mold plates are separated along the parting line and each encapsulated device is removed from a mold cavity and trimmed of excess plastic which has solidified in the runners and gates. Additional thermal treatment completes curing of the plastic package.

Following removal of each encased unit from its mold cavity and curing, the peripheral portions of the board may be excised from the board and any flash, i.e. plastic or other extraneous material removed from external terminals, etc. as known in the art, and the device is ready for use.

In devices having one side of the substrate configured for a ball grid array (BGA) or similar array on a circuit board, the molding process is conducted so that the surface of the circuit board having the ball grid array connections are formed on an outer surface of the package, such surface not being covered or encapsulated by the plastic material during the encapsulation process. When the substrate is sealably clamped on all sides of the cavity, plastic may reach the ball grid array side of the substrate only through the substrate, e.g. inadvertently through a hole or via. Of course, following removal from the cavity, any plastic encapsulant which may have reached and solidified on the ball grid array connection surface is removed.

The encapsulation process is typically performed before the "balls" of solder are placed on the pads of the grid array, in order to prevent possible inadvertent disforming or loss of any solder balls during encapsulation.

As disclosed in the prior art, various integrated circuit devices are configured for one-side enclosure or encapsulation, with an opposing bare or exposed side. U.S. Pat. No. 5,598,034 to Wakefield discloses an electronic device having a lower bare surface of a metallic heat conductor, to prevent overheating of the integrated circuit.

U.S. Pat. No. 5,608,262 of Degani et al. shows different semiconductor devices in which a printed wiring board surface or semiconductor chip surfaces are left uncovered.

In U.S. Pat. No. 5,222,014 of Lin, a stackable multi-chip module (MCM) is shown having several levels of chip-carrying substrates with accompanying ball-grid-arrays of terminals.

U.S. Pat. No. 5,615,089 of Yoneda et al. teaches the use of a first substrate carrying chips on both surfaces, and a second substrate carrying the first substrate, wherein the second substrate has a bare surface with arrayed terminals.

In U.S. Pat. No. 5,609,889 of Weber, a mold is described which has a biased plug that exerts pressure on a heat sink or circuit board to prevent molding compound from covering its surface. A passage is provided in the substrate circuit board so that plastic flows latitudinally under the circuit board into a cavity. The plug is biased by a plate spring to accommodate variations in the thickness of the substrate and ensure that the exterior surface of the heat sink does not become significantly encased in plastic.

In each of these references, the device is one-side encapsulated in a set of mold plates, one to a mold cavity.

U.S. Pat. No. 5,313,365 of Pennisi et al. discloses an electronic conductor-grid-array package including integrated circuits bonded to one side of a printed circuit board, and a grid array on the opposing side. Instead of using transfer molding techniques, the integrated circuits and associated wiring are encased in glob-top encapsulant. Typically, glob-top encapsulation is more time consuming, less reliable, and yields a product having a less pleasing appearance than conventional transfer molding methods.

BRIEF SUMMARY OF THE INVENTION

The invention comprises an improved method and apparatus for encapsulating or enclosing electronic devices mounted on the first side of a substrate such as a circuit board or wiring board. The invention may be particularly applied to one-side encapsulation or enclosing of electronic devices which includes a substrate such as a circuit board configured to have a ball-grid-array (BGA), pin-grid-array (PGA), land-grid-array (LGA) or similar set of multiple electrical terminals on its opposite side. The array terminals of such a substrate is typically configured to be bonded to terminals of another apparatus following encapsulation of the electronic devices including IC chip(s), leads, wiring and/or other components on its first side with plastic.

The method and apparatus of the invention may also be applied to a device having an exposed heat sink or heat dissipation device on one side of the substrate.

In the invention, a pair of mold plates is modified from a conventional configuration so that two array packages may be simultaneously encapsulated, back to back, within a single mold cavity. Thus, the number of packages encapsulated in a mold machine may be doubled without any significant increase in packaging cycle time.

In one embodiment of the invention, the array surfaces of the two array packages are separated by a buffer member. The buffer member may be perforated or include a cut-out to accommodate array pads, balls, pins, etc. which protrude from the bare substrate surfaces and otherwise impinge on both major surfaces of the buffer member.

The mold plates useful for the practice of the invention are typically configured to be general mirror images of each other, each of the upper and lower plates provided with a feed runner and a vent runner for the simultaneous passage of plastic melt to each array package and venting of gases therefrom.

The method is applicable to a wide variety of substrate-based conductor-grid-array packages, including those mounted on monolayer substrates, multi-layer circuit board substrates, multi-chip-modules (MCM), etc. The production rate is effectively doubled, and encapsulation of devices with different substrate thicknesses may be performed without adjustment of the mold plate spacing.

The present invention is further directed to the use of mold-like plates to apply preformed covers over the semiconductor devices on the substrates.

BRIEF DESCRIPTION OF THE DRAWINGS

The invention is illustrated in the following figures, wherein the elements are not necessarily shown to scale. Corresponding parts are identified by the same numerals throughout the drawings.

DESCRIPTION OF THE ILLUSTRATED EMBODIMENTS

A method for rapid one-side encasing of array packages and an apparatus for performing such packaging as described. The several aspects of the invention are particularly applicable to substrate-mounted arrays of ball grids, pin grids and land-grids with various encapsulable devices mounted on the opposite side of the substrate. In addition, devices having exposed heat sinks or heat radiators on the opposite side of an otherwise impermeable substrate may be rapidly one-side encapsulated by the method and apparatus of the invention. The method and apparatus are applicable to any device including a generally planar substrate, wherein one side of the substrate is to be non-encapsulated in the final packaged form.

Figure 1:
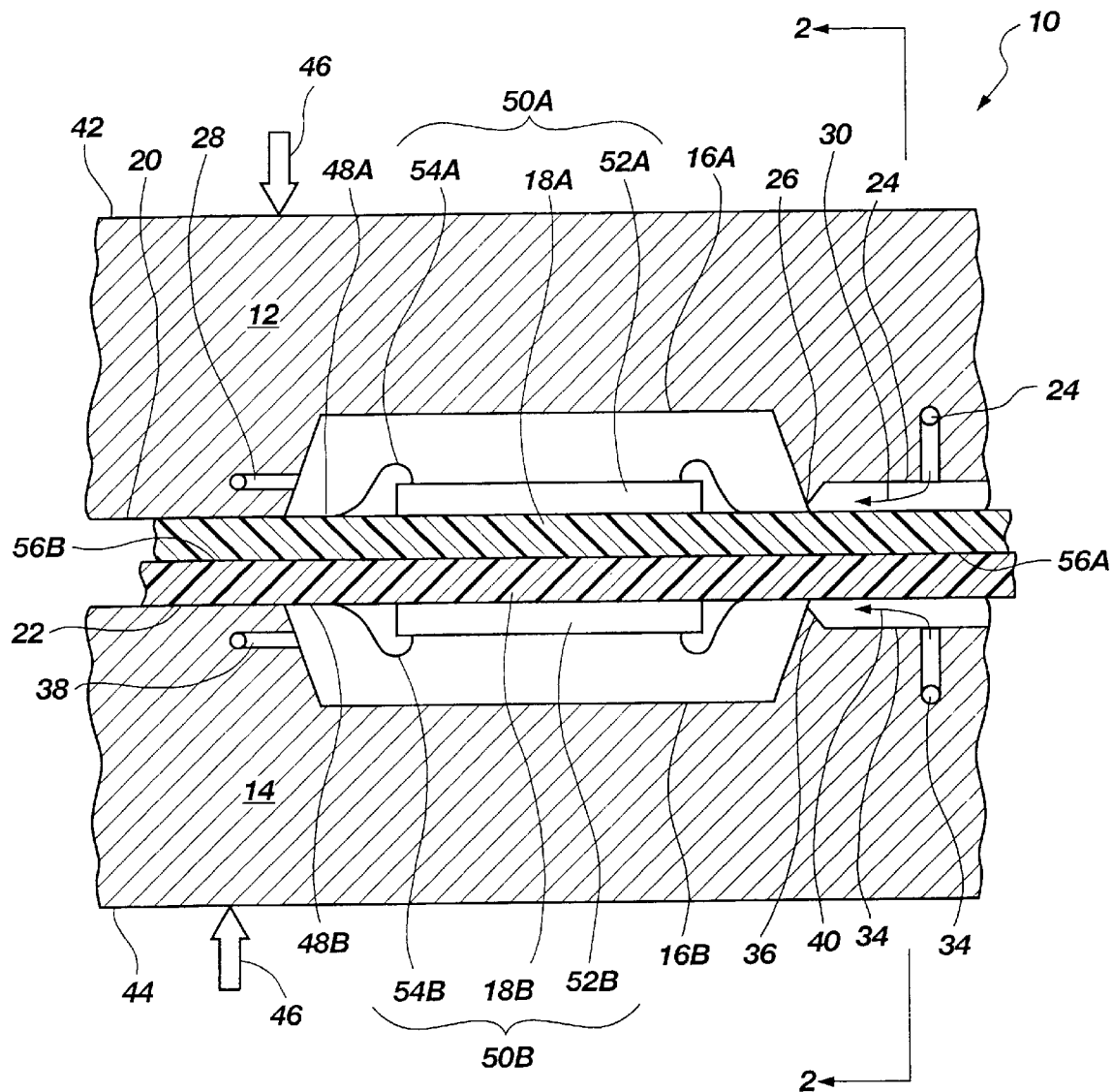
FIG. 1 is a cross-sectional end view through a portion of a molding machine of the invention for encapsulating two semiconductor devices mounted on planar substrates.
Figure 2:
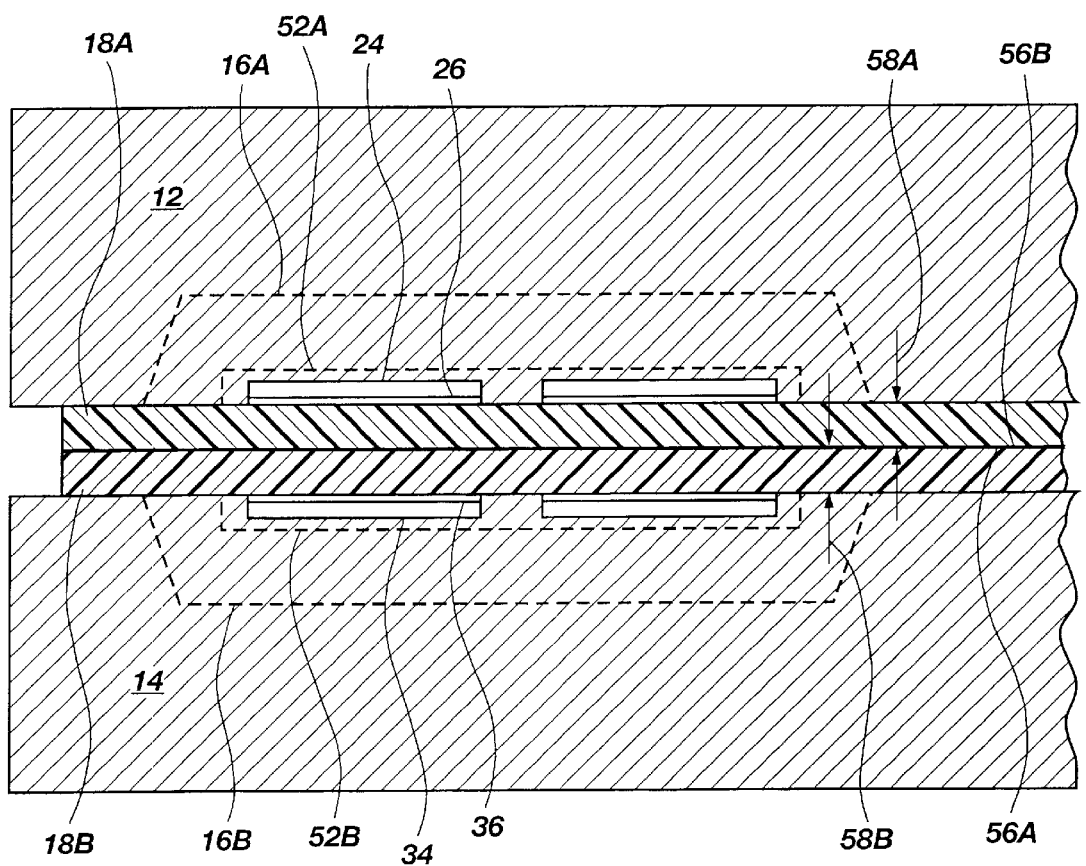
FIG. 2 is a cross-sectional side view through a portion of a molding machine of the invention, as taken along line 2—2 of FIG. 1.

With reference to the drawings of FIGS. 1–8, and particularly to FIGS. 1 and 2, a portion of a molding machine 10 is depicted, including portions of an upper mold plate 12 and a lower mold plate 14. A mold cavity 16 is shown as comprising cut-out portions of each mold plate 12, 14. In practice, the number of cavities 16 in a pair of mating mold plates 14, 16 may be any number, but usually is about 10 to 100, as needed to match the number of electronic units formed on a given substrate strip 18 and to attain the desired production rate.

The terms "upper" and "lower" are used herein for the sake of convenience only, inasmuch as the upper and lower mold plates may be exchanged in position if desired.

The upper mold plate 12 is shown as similar to a conventional, generally rectangular plate member with multiple upper cavity portions 16A along its mold face, i.e. lower flat surface 20. Each upper cavity portion 16A has an upper feed runner 24 with gate 26 for injecting a first fluid plastic 30, typically a thermoset resin, into the upper cavity portion at a controlled rate. In addition, an upper vent runner 28 for venting gas, e.g. air, from the upper cavity portion 16A during encapsulation is shown.

The lower mold plate 14 is typically a substantially mirror image of the upper mold plate 12, although it does not need to be such a mirror image, having lower cavity portion 16B which mates with the upper cavity portion 16A. Thus, the upper cavity portion 16A and mating lower cavity portion 16B together comprise a complete mold cavity 16. Each lower cavity portion 16B has a lower feed runner 34 with gate 36 for injecting a second fluid plastic 40 into each lower cavity portion at a controlled rate. Although the fluid plastics 30 and 40 may usually be the same material, encapsulants of differing composition may be used as described herein, infra. In addition, although the first fluid plastic 30 and second fluid plastic 40 are typically injected simultaneously, they may alternatively be injected in sequence, particularly if they differ.

In accordance with the invention, two electronic devices 50A and 50B are shown within the mold cavity 16, in a back-to-back orientation, the second sides 56A and 56B at substrates 18A and 18B, respectively, in abutment. Upper device 50A comprises a planar substrate 18A having a first side 48A upon which a semiconductor die 52A is attached and electrically connected thereto by wires 54A. Likewise, lower device 50B is shown as comprising a planar substrate 18B having a first side 4813 upon which a semiconductor die 52B is attached and electrically connected via wires 54B or some other suitable method. The first and second devices 50A, 50B may each have an array of conductive terminals, e.g. pads, not visible, on its substrate second side 56A or 56B, respectively, each array of terminals connected by conductors (not shown) passing through the respective substrate 18A or 18B to the wires 54A, 54B of the device.

It is understood that the two devices 50A, 50B may be substantially identical, or may differ, for example, in the particular numbers and types of components attached to the substrate, in substrate composition and thickness, etc. The specifications of the two devices 50A and 50B may differ with respect to the encapsulant, and the mold plates 12, 14 and methods of this invention provide for simultaneous one-side encapsulation of different devices with different materials. Materials typically used for such encapsulation include epoxy resins, organosilicon polymers, polyimide, etc.

The upper mold plate 12 generally has a flat upper surface 42, and the lower mold plate 14 has a flat lower surface 44. Following placement of the devices 50A, 50B back-to-back between the mold plates 12, 14, compressive forces 46 are exerted upon surfaces 42, 44 to clamp the mold plates 12, 14 against the pair of substrates 18A, 18B, and the encapsulation process may proceed without leakage. The array of terminals is configured to be positioned outside of the area under high compression to avoid damage to the terminals. Thus, the area under compression is "circumferential" about each cavity, where "circumferential" refers to the excluded area rather than any circularity. The cavities are usually rectangular in shape rather than round.

Although the surfaces 20, 22 of the upper mold plate 12 and lower mold plate 14, respectively, are shown in FIG. 1 as planar, one or both of the surfaces 20, 22 may incorporate projecting ridges by which the compressive forces 46 are concentrated over a relatively small area of the substrates 18A, 18B. If this is done, the terminals of the array may be both inside and outside of the circumferential ridge about a mold cavity 16A or 16B or both.

Figure 3:
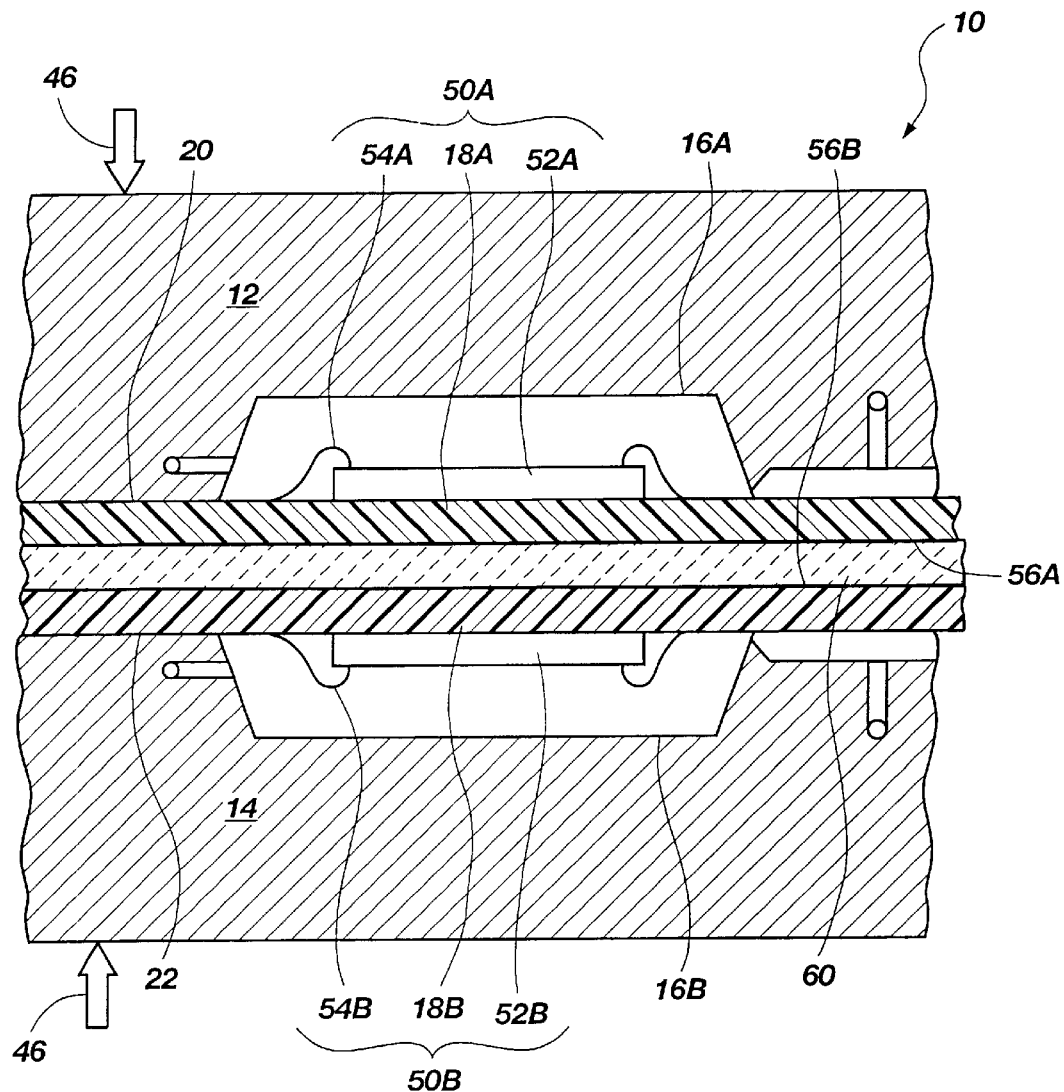
FIG. 3 is a cross-sectional end view through a portion of a molding machine, illustrating another embodiment of the invention.

FIG. 3 depicts the same mold plates 12, 14 as shown in FIGS. 1 and 2. In this embodiment, a buffer member 60 is placed between second side 56A of substrate 18A and the second side 56B of substrate 18B. As indicated previously, both of these sides 56A, 56B have terminal grid arrays such as pads, solder balls, pins, etc. or they include bare surface heat sinks or heat dissipators. These elements require protection from high compression forces, lateral forces, and the flow of encapsulant during the packaging process.

Figure 4:
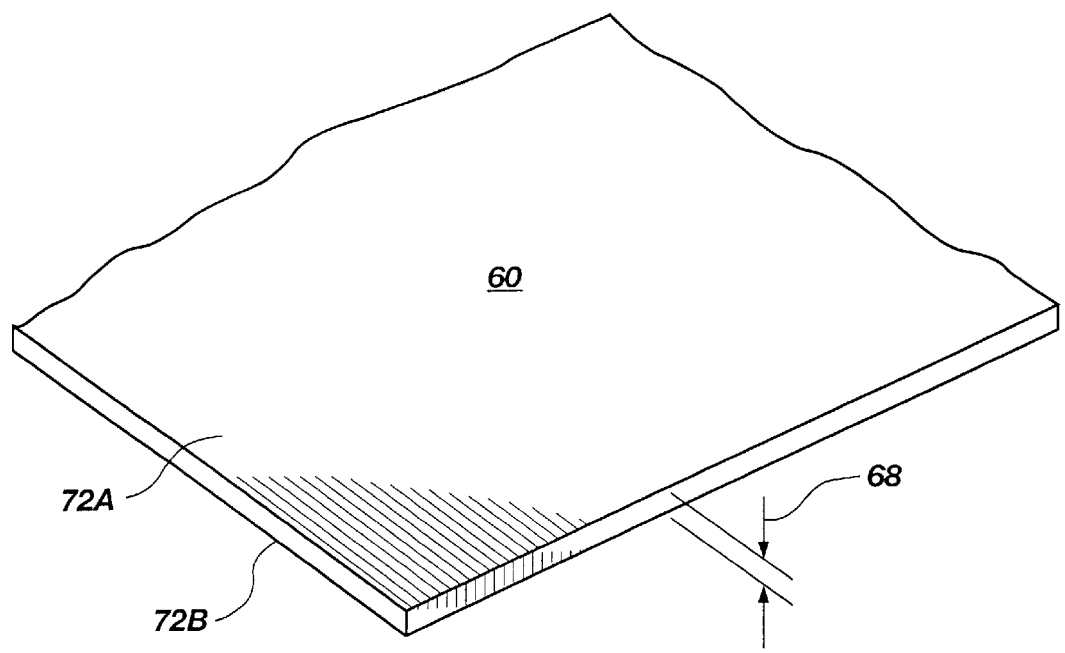
FIG. 4 is a perspective view of an exemplary planar intermediate buffer member useful in an encapsulation method of the invention.

A buffer member 60 is illustrated in FIG. 4 as a flat or planar body typically with parallel surfaces 72A, 72B, and having thickness 68. Typically, the buffer member 60 will be continuous and generally coextensive with each strip of substrate 18A, 18B. The buffer member 60 may alternatively be formed of multiple portions more readily fitted to the arrays of balls, pins, pads, etc.

The buffer member 60 serves several purposes:

First, buffer members 60 of differing thicknesses may be readily provided for encapsulation of packages having varying substrate thicknesses 58A, 58B (see FIG. 2). For example, when a pair of array devices 50A, 50B having a reduced substrate thickness 58A and/or 58B is to be one-side encapsulated, a buffer member 60 of greater thickness dimension 68 may be used to compensate for the thinner substrates 18A, 18B. The tedious adjustment of the molding machine 10 for a different mold plate clearance to accommodate varying substrate thicknesses 58A, 58B may be avoided.

Second, the buffer member 60 absorbs some of the compressive forces 46 exerted during the encapsulation, protecting the array terminals from breakage or distortion.

Third, the buffer member 60 may be adapted to accommodate projecting array terminals such as pin-grid arrays and ball-grid-arrays, etc., preventing damage to the pins or solder balls resulting from compression against the opposite substrate or the buffer member 60 itself.

Fourth, the buffer member 60 enhances the ease of separating the two array devices 50A, 50B without damage, following encapsulation.

The buffer member 60 does not become part of a packaged device and may be, for example, a thin metallic member such as aluminum, copper, or various other suitable materials. Alternatively, the buffer member 60 may comprise a plastic material such as polyimide, polytetrafluoroethylene, silicones, epoxies, etc. The buffer member 60 may also be a circuit board or wiring board, or other material. As best delineated, the material has a rigidity which limits the degree to which it will deform under the typical compression range useful in the encapsulation process. Thus, the material will typically become compressed under the exerted compression forces.

In addition, the buffer material will be non-adhesive, not adhering to either substrate.

Figure 6:
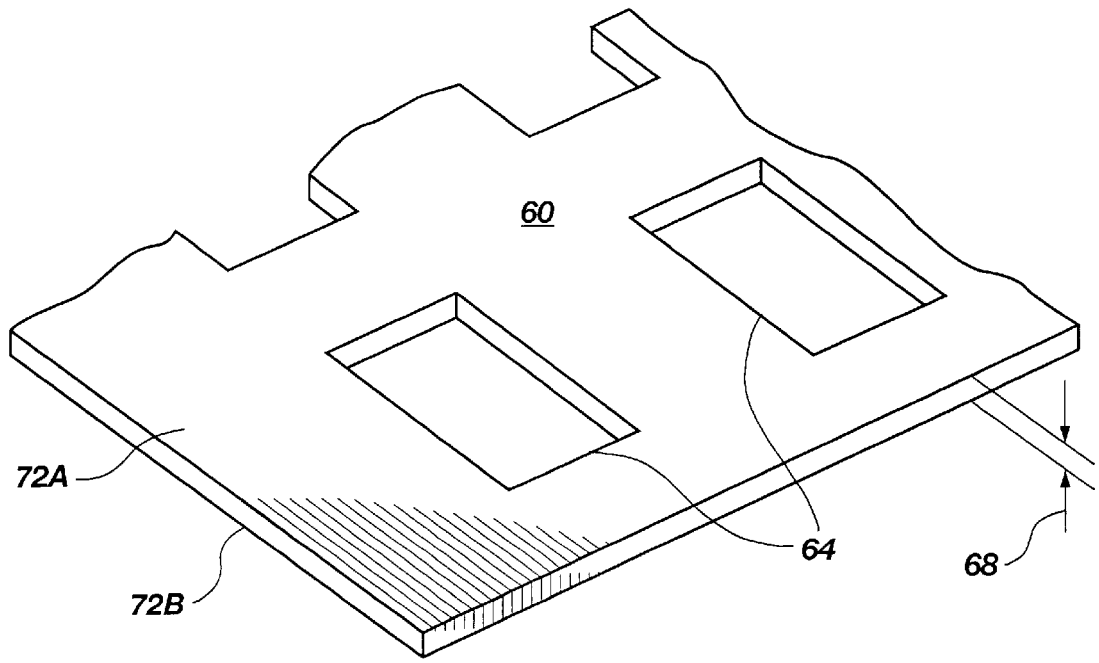
FIG. 6 is a perspective view of another exemplary planar intermediate buffer member useful in an encapsulation method of the invention.
Figure 5:
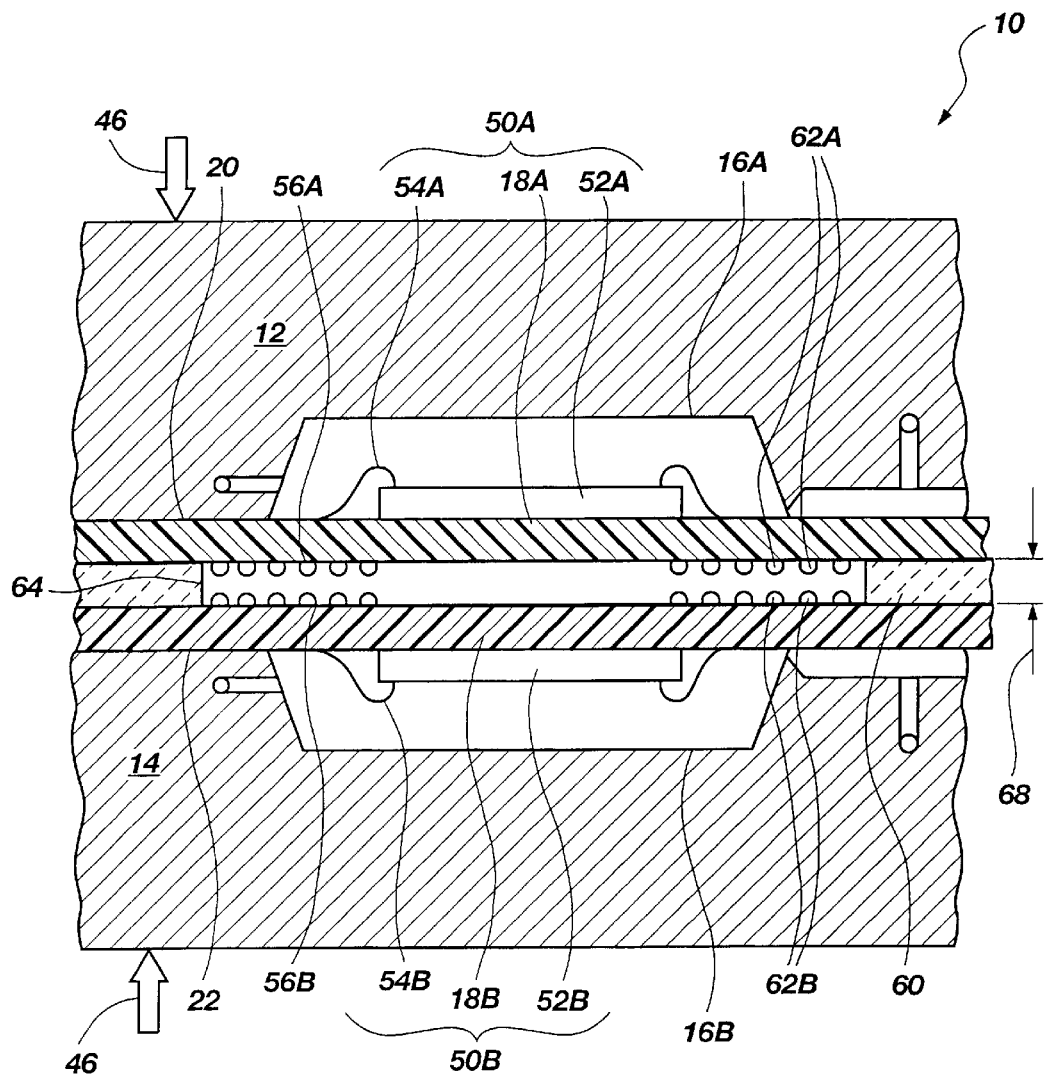
FIG. 5 is a cross-sectional end view through a portion of a molding machine, illustrating the use of another embodiment of the buffer member of the invention.

In FIG. 5, the molding plates of FIG. 1 are shown in a method for one-side encapsulation of a pair of typical devices 50A and 50B, each comprising components 52A, 54A (or 52B, 54B) mounted on a substrate 18A (or 18B) such as a circuit board with a ball-grid-array of solder balls 62A, 62B, respectively. The devices 50A, 50B are placed back-to-back in the mold cavity 16, with an intervening buffer member 60. The substrates and buffer member 60 form a "laminar" arrangement, though they are not attached to each other. As depicted in FIGS. 5 and 6, the buffer member 60 includes cut-outs 64 and 66, respectively, into which the arrays of solder balls 62A and 62B are positioned. The thickness 68 of the buffer member 60 in a compressed condition enables the solder balls 62A, 62B from both substrates 18A, 18B to fit within the cut-outs 64, 66 without touching, so that deformation or damage to the solder balls is avoided. For typical ball-grid-arrays (BGA), the thickness 68 of the buffer member 60 will be sufficient to accommodate both sets of solder balls 62A, 62B. Where used for pin-grid-arrays (PGA), the required thickness will vary depending upon pin length.

Unlike the method shown in FIG. 1, this method enables one-side encapsulation of devices following installation of the solder balls.

As already indicated, this method is shown in FIG. 5 for devices with ball-grid-arrays (BGA). The method shown in FIG. 5 is equally useful for substrates in which a pin-grid-array (PGA) or land-grid-array (LGA), etc., or others, with pads having already been provided in the substrate.

The cut-out 64 and 66 may be made in the buffer member 60 by any feasible method, including stamping or laser cutting.

Figure 7:
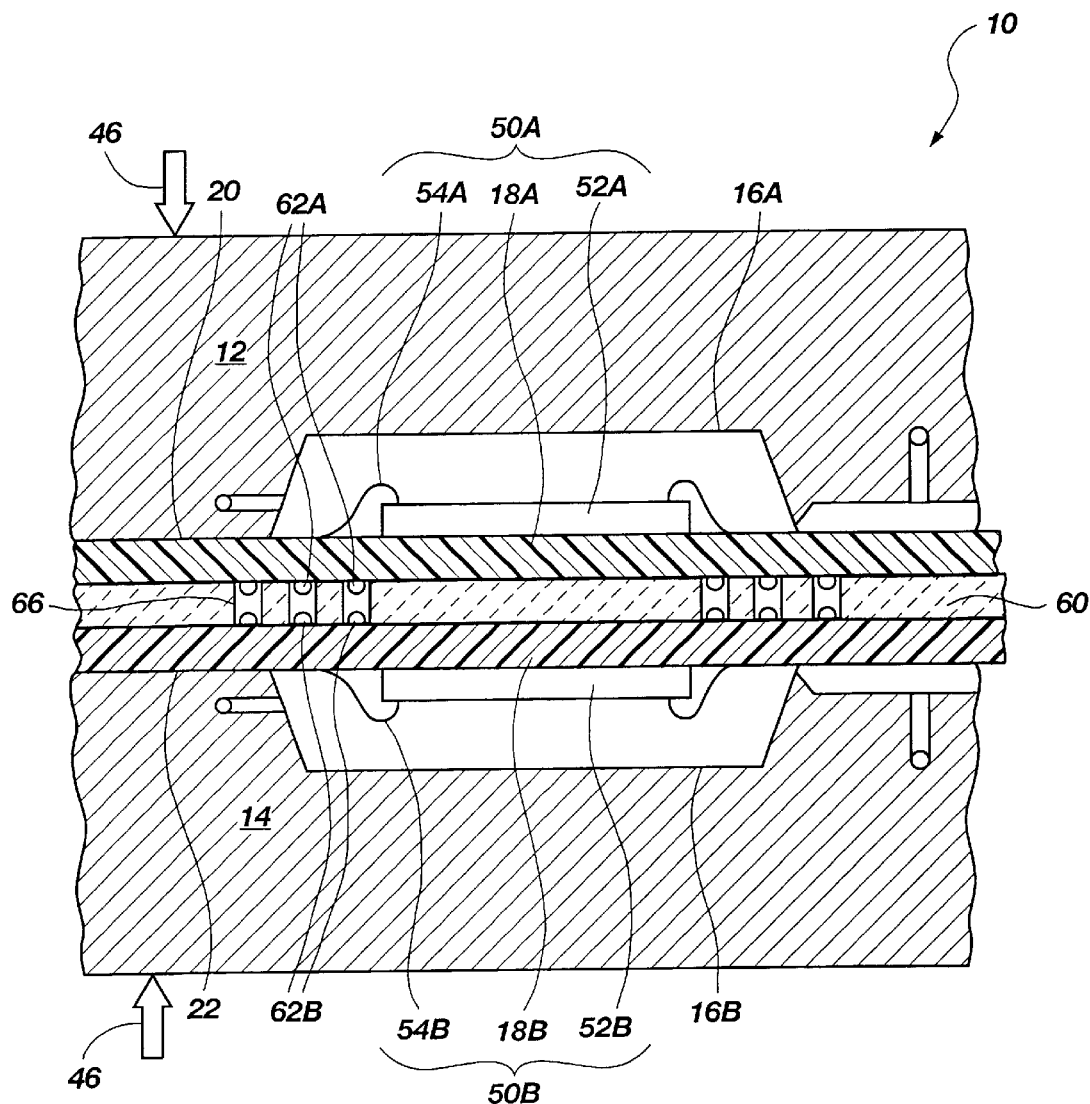
FIG. 7 is a cross-sectional end view through a portion of a molding machine, illustrating the use of a further embodiment of the buffer member of the invention.
Figure 8:
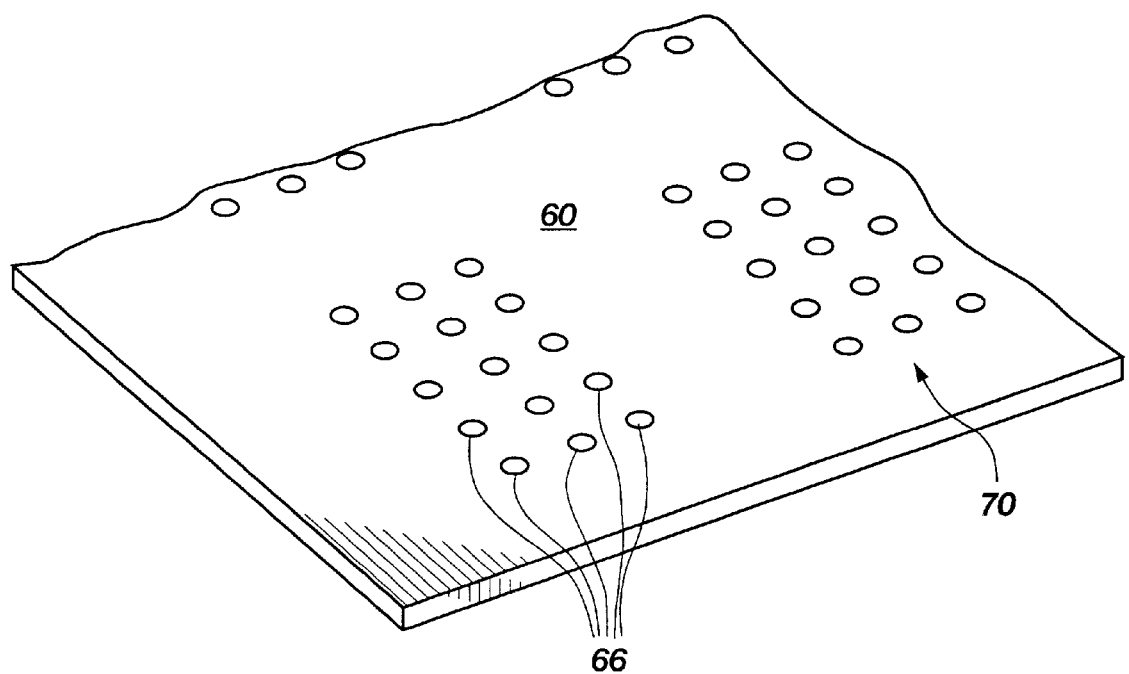
FIG. 8 is a perspective view of a further embodiment of a planar intermediate buffer member useful in an encapsulation method of the invention.

FIGS. 7 and 8 illustrate a further embodiment of the invention. The buffer member 60 is perforated with groupings 70 of cut-outs 66 to accommodate array pads, balls, pins, etc. which protrude from the bare substrate second sides 56A, 56B and which otherwise would impinge on both major surfaces 72A, 72B of the buffer member. The cut-outs 66 are aligned with the conductors and are of such a size to accommodate the usual variability in positioning of the substrates 18A, 18B on the buffer member 60. The cut-outs 66 in the buffer member 60 may be formed by any method capable of forming small holes, including laser cutting or "drilling", and extend from the upper surface 72A to the lower surface 72B.

Buffer members 60 may be easily and quickly fabricated in a variety of thicknesses 68, using conventional techniques. Thus, a wide variety of device designs may be one-side encapsulated without adjustment of the molding machine tolerances.

The buffer member 60 may typically be re-used more than once, and may be usable repeatedly, thus saving time and materials.

The buffer member 60 may be formed of a variety of relatively inexpensive materials, because it does not require very specific qualities such as chemical resistance, etc.

Figure 9:
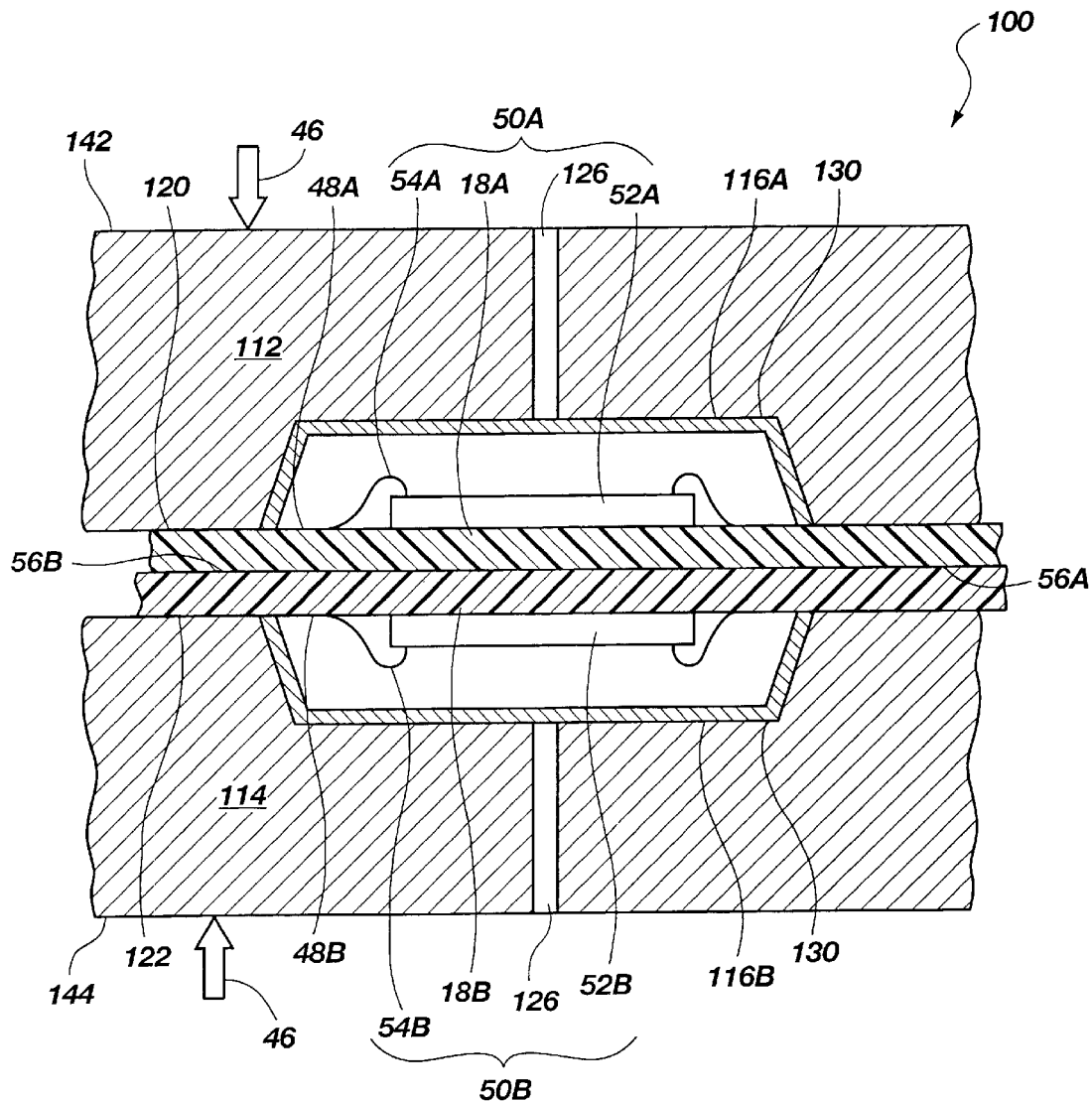
FIG. 9 is a cross-sectional end view through a portion of an apparatus of another embodiment of the invention for applying a cover to the two semiconductor devices mounted on planar substrates.

With reference to FIG. 9, another embodiment of the present invention is illustrated wherein portions of a isothermal blocks of an apparatus 100 are depicted, including portions of an upper isothermal plate 112 and a lower isothermal plate 114. A cavity 116 is shown as comprising cut-out portions of each plate 112, 114. In practice, the number of cavities 116 in a pair of mating plates 112, 114 may be any number, but is about 10 to 100, as needed to match the number of electronic units formed on a given substrate strip 18 and to attain the desired production rate.

The terms "upper" and "lower" are used herein for the sake of convenience only, inasmuch as the upper and lower plates may be exchanged in position if desired.

The upper plate 112 is shown as similar to a conventional, generally rectangular plate member with multiple upper cavity portions 116A along its face, i.e. lower flat surface 120. Each upper cavity portion 116A has an aperture 126 therein connected to a source of vacuum.

The lower plate 114 is a substantially mirror image, although not required, of the upper plate 112, having lower cavity portion 116B which mates with the upper cavity portion 116A. Thus, the upper cavity portion 116A and mating lower cavity portion 116B together comprise a complete cavity 116. Each lower cavity portion 116B has an aperture 126 therein connected to a source of vacuum.

In accordance with the invention, two electronic devices 50A and 50B are shown within the cavity 116, in a back-to-back orientation, the substrate second sides 56A and 56B, respectively, in abutment. Upper device 50A comprises a planar substrate 18A having a first side 48A upon which a semiconductor die 52A is attached and electrically connected thereto by wires 54A or some other suitable connection. Likewise, lower device 50B is shown as comprising a planar substrate 18B having a first side 48B upon which a semiconductor die 52B is attached and electrically connected via wires 54B. The first and second devices 50A, 50B may each have an array of conductive terminals, e.g. pads, not visible, on substrate second side 56A or 56B, respectively, each array of terminals connected by conductors (not shown) passing through the respective substrate 18A or 18B to the wires 54A, 54B of the device.

Contained within cavity 116A of upper plate 112 is a cover 130 being held therein through the use of a vacuum supplied through aperture 126 after being placed therein in any suitable manner. Similarly, contained within cavity 116B of lower plate 114 is a cover 130 being held therein through the use of a vacuum supplied through aperture 126 after being placed therein in any suitable manner. The covers 130 may be of any type of any suitable material in suitable shape for application to the substrate 18A or 18B to encase the semiconductor die 52A and 52B respectively.

It is understood that the two devices, 50A and 50B may be substantially identical, or may differ, for example, in the particular numbers and types of components attached to the substrate, in substrate composition and thickness, etc. The specifications of the two devices 50A and 50B may differ with respect to the cover 130 and the plates 112, 114 and methods of this invention provide for simultaneous one-sided encapsulating of different devices with different materials.

The upper plate 112 generally has a flat upper surface 142, and the lower plate 114 has a flat lower surface 144. Following placement of the devices 50A, 50B back-to-back between the plates 112, 114, compressive forces 46 are exerted upon surfaces 142, 144 to clamp the plates 112, 114 against the pair of substrates 18A, 18B and the process proceeds to attach, such as by using adhesive bonding, the covers 130 to the substrate 18A, 18B. The lower edge of each cover 130 may be coated with a suitable adhesive to attach the cover 130 to the substrate 18A, 18B. The wire bonds to the circuits of the substrate 18A, 18B are placed to be located outside the area of compression of the edge of the cover 130 on the substrate 18A, 18B. As stated, the cover 130 may be of any shape desired to enclose and isolate a desired area on the substrate 18A, 18B.

Figure 10:
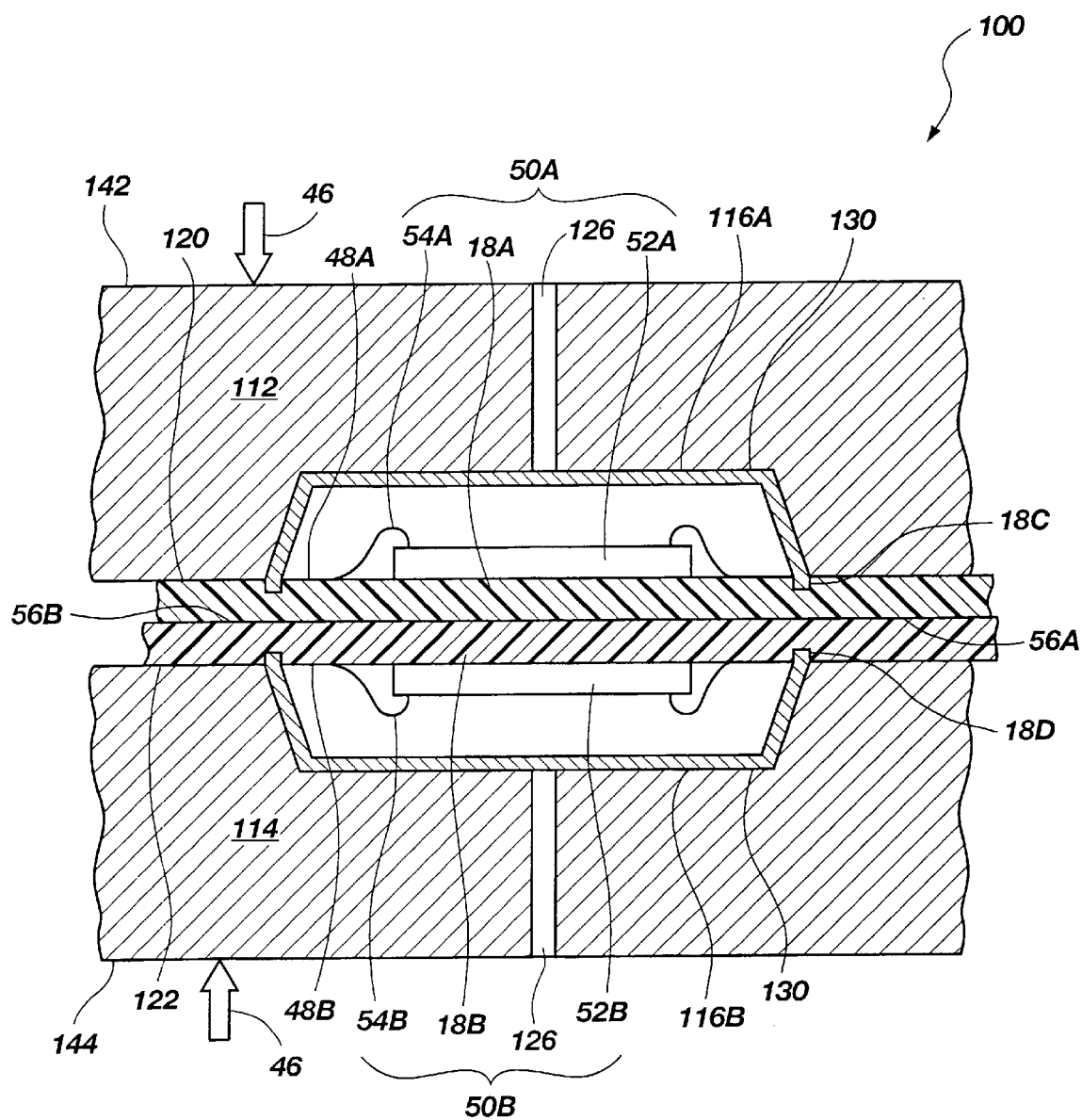
FIG. 10 is a cross-sectional end view through a portion of an apparatus of another embodiment of the invention for applying another type cover to the two semiconductor devices mounted on planar substrates.

Referring to FIG. 10, another embodiment of the present invention is shown such as illustrated in FIG. 9, except that each cover 130 has the lower edge thereof secured in a recess 18C or 18D formed in substrate 18A, 18B respectively. The lower edge of cover 130 may be secured in the recess 18C, 18D of substrate 18A, 18B, respectively, by means of a suitable, adhesive or any other suitable, well-known attachment.

Figure 11:
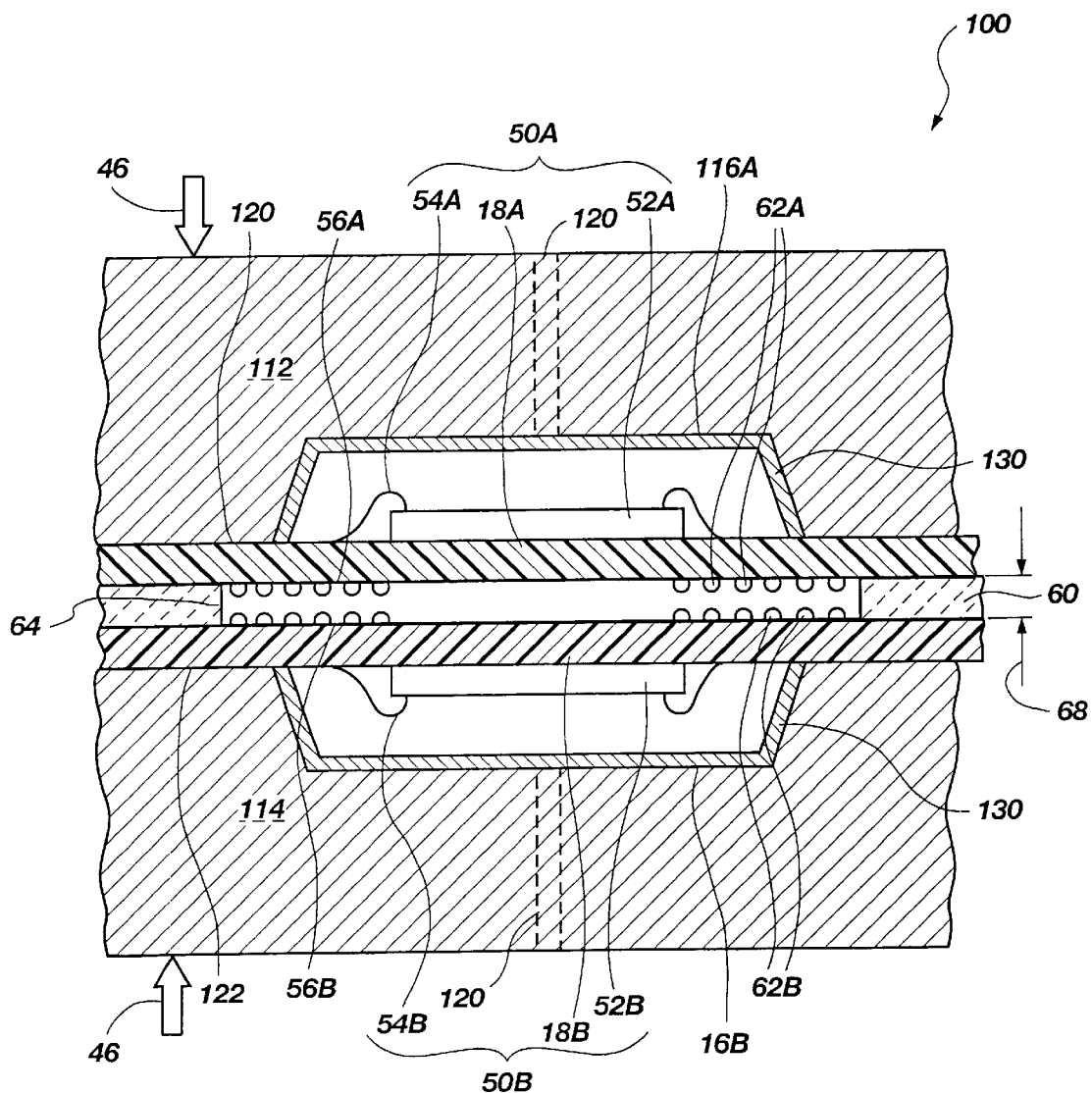
FIG. 11 is a cross-sectional end view through a portion of an apparatus of another embodiment of the invention for applying a cover to the two semiconductor devices mounted on planar substrates, illustrating the use of an embodiment of the buffer member of the invention.

Referring to FIG. 11, another embodiment of the present invention is shown wherein the plates of FIG. 9 are used for one-side encapsulation of a pair of typical devices 50A and 50B, each comprising components 52A, 54A (or 52B, 54B) mounted on a substrate 18A (or 18B) such as a circuit board with a ball-grid-array of solder balls 62A, 62B, respectively. The devices 50A, 50B are placed back-to-back in the mold cavity 116, with an intervening buffer member 60. The substrates and buffer member 60 form a "laminar" arrangement, though they are not attached to each other. As depicted in FIGS. 11 and 5, the buffer member 60 includes a cut-out 64 and 66 respectively, into which the arrays of solder balls 62A and 62B are positioned. The thickness 68 of the buffer member 60 in a compressed condition enables the solder balls 62A, 62B from both substrates 18A, 18B to fit within the cut-out 64 without touching, so that deformation or damage to the solder balls is avoided. The cover 130 is attached to substrate 18A, 18B by any suitable arrangement, such as adhesive bonding, etc.

Figure 12:
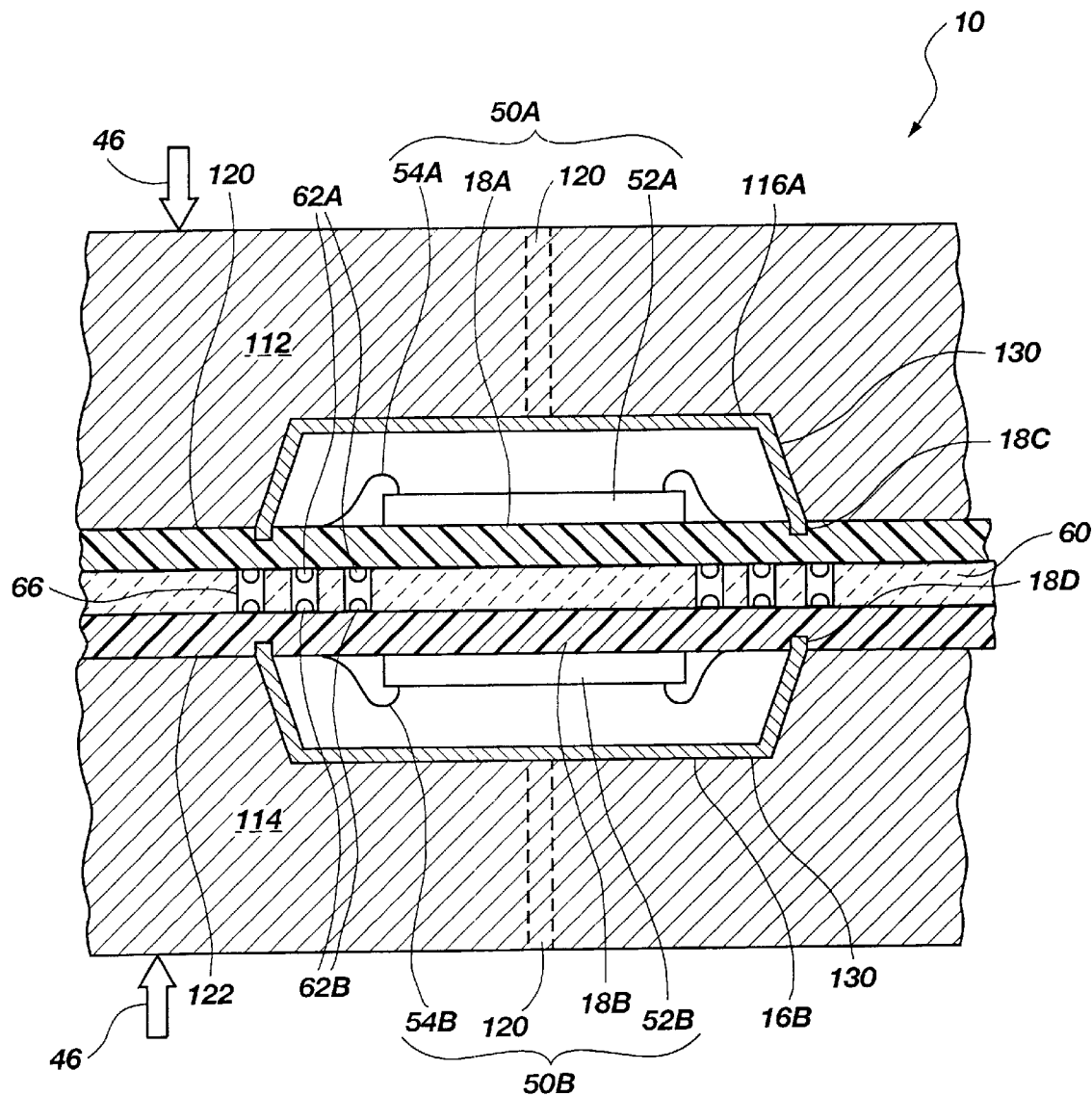
FIG. 12 is a cross-sectional end view through a portion of an apparatus of another embodiment of the invention for applying a cover to the two semiconductor devices mounted on planar substrates, illustrating the use of a further embodiment of the buffer member of the invention.

Referring to FIG. 12, another embodiment of the invention is shown with the outer edge of cover 130 being retained in a recess 18C, 18D of the substrate 18A, 18B respectively. The cover 130 may be secured in the recess 18C, 18D of substrate 18A, 18B by any suitable arrangement, such as adhesive bonding, etc.

Use of the foregoing apparatus and methods effectively doubles the production rate of a transfer molding machine or like apparatus to apply covers to the substrates without increasing the rejection rate. This results in a much lower unit cost. The grid-arrays of pads, solder balls or pins, as well as any bare heat sinks or heat dissipators, are protected from damage.

If desired, devices of different designs may be one-side encapsulated together within a mold cavity, and may even be simultaneously encapsulated with different materials. Such is further applicable for the application of covers to the substrates to encase the semiconductor die.

It is apparent to those skilled in the art that various changes and modifications may be made to the biased floating plate apparatus and relief/venting apparatus of the invention as disclosed herein without departing from the spirit and scope of the invention as defined in the following claims.

What is claimed is:

1. A method for encapsulation of a plurality of electronic devices within a mold cavity, each electronic device having at least one electronic component mounted on a first side of a substrate, said method comprising:

providing at least one electronic component on a first side of a first substrate, said first substrate having a first side and having a second side:

providing at least one electronic component on a first side of a second substrate, said second substrate having said first side and having a second side;

providing upper and lower mating mold plates, each mold plate of said upper and lower mold plates having a mold cavity portion, each said mold cavity portion of said upper and lower mold plates having a feed runner leading from a material supply to said mold cavity portion, said mold cavity portions together comprising said mold cavity;

placing said first substrate having said at least one electronic component on said first side thereof and said second substrate having said at least one electronic component on said first side thereof into said mold cavity, said first substrate and said second substrate each having said second side thereof being located between said upper and lower mold plates;

moving said upper and lower mold plates toward each other to form said mold cavity, portions of said upper mold plate engaging portions of the first surface of said first substrate and portions of said lower mold plate engaging portions of the first surface of said second substrate;

injecting a first material into said upper mold cavity portion and a second material into said lower mold cavity portion to separately encapsulate said at least one electronic component on said first side of said first substrate and said at least one electronic component on said first side of said second substrate and said at least one electronic component on said first side of said second substrate; and removing said first substrate and said second substrate from said upper and lower mating mold plates, said first substrate and said second substrate each having at least one encapsulated electronic component on said first side thereof.

2. The method of claim 1, wherein each mold cavity portion of said upper and lower mold plates includes a vent runner connected thereto for venting said mold cavity portion.

3. The method of claim 1, wherein the step of injecting said second material into said lower mold cavity portion comprises injection of a material substantially identical to said first material.

4. The method of claim 1, wherein the step of injecting said second material into said lower mold cavity portion comprises injection of a material substantially different from said first material.

5. The method of claim 1, wherein said first material and said second material are injected substantially simultaneously.

6. The method of claim 1, wherein said first material and said second material are injected at different times.

7. The method of claim 1, further comprising the step of cleaning said second side of each of said first substrate and said second substrate.

8. The method of claim 1, further comprising the step of curing said plurality of electronic devices at an elevated curing temperature.

9. A method for encapsulation of a plurality of electronic devices within a mold cavity, each electronic device of said plurality of electronic devices having at least one electronic component mounted on a first side of a substrate, said method comprising:

providing at least one electronic component on a first side of a first substrate, said first substrate having said first side and having a second side:

providing at least one electronic component on a first side of a second substrate, said second substrate having said first side and having a second side;

providing upper and lower mating mold plates, each mold plate of said upper and lower mating mold plates having a mold cavity portion, each said mold cavity portion of said upper and lower mold plates having a feed runner leading from a material supply to said mold cavity portion, said mold cavity portions together comprising said mold cavity;

placing said first substrate having at least one electronic component on said first side thereof and said second substrate having said at least one electronic component on said first side thereof into said mold cavity, said second side of said first substrate and said second side of said second substrate placed in a back-to-back orientation between said upper and lower mold plates;

moving said upper and lower mold plates to form said mold cavity, portions of said upper mold plate engaging portions of the first surface of said first substrate and portions of said lower mold plate engaging portions of the first surface of said second substrate;

injecting a first material into said mold cavity portion of said upper mold plate and a second material into said mold cavity portion of said lower mold plate to separately encapsulate said at least one electronic component mounted on said first side of each of said first and second substrates of said plurality of electronic devices; and removing said plurality of electronic devices from said mold cavity.

10. The method of claim 9, wherein each mold cavity portion of said upper and lower mold plates is connected to a vent runner for venting said mold cavity portion.

11. The method of claim 9, wherein the step of injecting said second material into said lower mold cavity portion comprises injection of a material substantially identical to said first material.

12. The method of claim 9, wherein the step of injecting said second material into said lower mold cavity portion comprises injection of a material substantially different from said first material.

13. The method of claim 9, wherein said first material and said second material are injected substantially simultaneously.

14. The method of claim 9, wherein said first material and said second material are injected at different times.

15. The method of claim 9, further comprising the step of cleaning said second side of each of said first substrate and said second substrate.

16. The method of claim 9, further comprising the step of subjecting said plurality of electronic devices to a curing temperature.

17. The method of claim 9, wherein said second side of each of said first substrate and said second substrate of said electronic device includes solder bumps thereon.

* * * * *

UNITED STATES PATENT AND TRADEMARK OFFICE
CERTIFICATE OF CORRECTION

PATENT NO. : 6,117,382
DATED : September 12, 2000
INVENTOR(S) : Thummel

It is certified that error appears in the above-identified patent and that said Letters Patent is hereby corrected as shown below:

Drawings,
Fig. 5, insert reference numeral -- 66 -- and indicator line therefor;
Fig. 11, change both reference numerals "120" at top center and bottom center indicating "apertures" to -- 126 --; insert reference numeral -- 66 -- and indicator line therefor; and change reference numeral "16B" at bottom to -- 116B --; and
Fig. 12, change reference numeral "10" at top to -- 100 --; change both reference numerals "120" at top center and bottom center indicating "apertures" to -- 126 --; and change reference numeral numeral "16B" at bottom to -- 116B --.

Column 1,
Lines 33 and 61, after "e.g." insert -- , --;
Line 46, after "i.e." insert -- , --;

Column 2,
Line 11, after "i.e." insert -- , --;
Lines 15, 17, 21-22 and 25, change "ball grid array" to -- ball-grid-array --;
Line 23, after "e.g." insert -- , --;
Line 36, after "conductor" delete ",";
Line 64, after "in" insert -- a --;

Column 3,
Line 14, after "array" insert -- of --;
Line 24, change "back to back" to -- back-to-back --;

Column 4,
Line 36, change "as" to -- are --;
Line 39, change "land-grids" to -- land grids --;
Line 54, change "14, 16" to -- 12, 14 --;

Column 5,
Line 4, change "a substantially" to -- substantially a --;
Line 11, after "gate 36" insert -- along upper flat surface 22 --;
Line 18, after "differ." insert -- Lower vent runner 38 for venting gas, etc., from lower cavity portion 16B during encapsulation is shown. --;
Line 21, change "at" to -- of --;
Line 27, change "4813" to -- 48B --;
Line 66, after "cavity" insert -- portion --;

UNITED STATES PATENT AND TRADEMARK OFFICE
CERTIFICATE OF CORRECTION

PATENT NO. : 6,117,382
DATED : September 12, 2000
INVENTOR(S) : Thummel

It is certified that error appears in the above-identified patent and that said Letters Patent is hereby corrected as shown below:

Column 6,
Line 33, change "pin-grid arrays" to -- pin-grid-arrays --;

Column 7,
Line 17, change "cut-out" to -- cut-outs --;
Line 45, delete "a";
Line 62, change "a substantially" to -- substantially a --;
Line 64, after "116B" insert -- along its face, i.e., upper flat surface 122, --;

Column 8,
Line 27, after "type of" delete "any" and after "in" insert -- any --;

Column 9,
Line 7, after "66" insert -- , --;
Line 7, change "a cut-out" to -- cut-outs --; and
Line 11, change "cut-out 64" to -- cut-outs 64, 66 --.

Column 9, claim 1,
Line 41, after "device" insert -- of said plurality of electronic devices --;
Line 45, after "having" change "a" to -- said --;
Line 46, change ":" to -- ; --;
Line 66, change "surface" to -- side --;

Column 10, claim 1,
Line 2, change "surface" to -- side --;
Lines 9-11, after "substrate" on line 9, delete remainder of text through and including "substrate" on line 11;
Line 14, after "having" insert -- said --;

Column 10, claim 2,
Line 17, after "each" insert -- said --;

Column 10, claim 9,
Line 47, change ":" to -- ; --;
Line 58, after "having" insert -- said --;

UNITED STATES PATENT AND TRADEMARK OFFICE
CERTIFICATE OF CORRECTION

PATENT NO. : 6,117,382
DATED : September 12, 2000
INVENTOR(S) : Thummel

It is certified that error appears in the above-identified patent and that said Letters Patent is hereby corrected as shown below:

Column 11, claim 9,
Line 1, change "surface" to -- side --;
Line 3, change "surface" to -- side --;
Line 8, after "of said first" and before "and" at end of line insert -- substrate --;
Line 9, change "second substrates" to -- said second substrate --;

Column 11, claim 10,
Line 13, after "each" insert -- said --; and

Column 12, claim 17,
Line 18, change "electronic device" to -- plurality of electronic devices --.

Signed and Sealed this

Ninth Day of April, 2002

*Attest:*

*Attesting Officer*

JAMES E. ROGAN
*Director of the United States Patent and Trademark Office*